United States Patent
Wang et al.

(10) Patent No.: US 8,143,683 B2
(45) Date of Patent: Mar. 27, 2012

(54) IN-SITU FORMED CAPPING LAYER IN MTJ DEVICES

(75) Inventors: Yung-Hung Wang, Dasi (TW); Yu-Jen Wang, Hsin-Chu (TW); Mark Juang, Hsin-Chu (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 35 days.

(21) Appl. No.: 12/756,743

(22) Filed: Apr. 8, 2010

(65) Prior Publication Data

US 2010/0193891 A1      Aug. 5, 2010

Related U.S. Application Data

(63) Continuation of application No. 12/032,973, filed on Feb. 18, 2008, now Pat. No. 7,723,128.

(51) Int. Cl.
*H01L 29/82* (2006.01)
(52) U.S. Cl. .............. 257/421; 257/640; 257/E21.665; 257/E29.323; 438/3
(58) Field of Classification Search .............. 257/421, 257/640, E29.323, E21.665; 438/3, 788, 438/758
See application file for complete search history.

(56) References Cited

U.S. PATENT DOCUMENTS

| | | | |
|---|---|---|---|
| 6,048,739 A | 4/2000 | Hurst et al. | |
| 6,884,630 B2 | 4/2005 | Gupta et al. | |
| 6,893,893 B2 | 5/2005 | Nallan et al. | |
| 6,970,376 B1 | 11/2005 | Fukuzumi | |
| 7,211,447 B2 | 5/2007 | Horng et al. | |
| 7,323,377 B1 | 1/2008 | Sedigh et al. | |
| 7,888,755 B2 * | 2/2011 | Hosomi et al. | 257/421 |
| 8,008,097 B2 * | 8/2011 | Parkin | 438/3 |
| 2004/0011380 A1* | 1/2004 | Ji et al. | 134/1.1 |
| 2005/0276099 A1 | 12/2005 | Horng et al. | |
| 2007/0164383 A1* | 7/2007 | Chen et al. | 257/427 |
| 2009/0108383 A1* | 4/2009 | Horng et al. | 257/421 |
| 2009/0209050 A1 | 8/2009 | Wang et al. | |

OTHER PUBLICATIONS

Hauser, H., et al., "Hysteresis Modeling of Tunneling Magnetoresistance Strain Sensor Elements," Journal of Applied Physics, vol. 95, No. 11, Jun. 1, 2004, pp. 7258-7260, American Institute of Physics.

Löhndorf, M., et al., "Highly Sensitive Strain Sensors Based on Magnetic Tunneling Junctions," Applied Physics Letters, vol. 81, No. 2, Jul. 8, 2002, pp. 313-315, American Institute of Physics.

Löhndorf, M., et al., "Strain Sensors Based on Magnetostrictive GMR/TMR Structures," IEEE Transactions on Magnetics, vol. 38, No. 5, Sep. 2002, pp. 2826-2828, IEEE.

* cited by examiner

Primary Examiner — Khiem D Nguyen
Assistant Examiner — Wilner Jean Baptiste
(74) Attorney, Agent, or Firm — Slater & Matsil, L.L.P.

(57) ABSTRACT

A method of forming an integrated circuit includes forming magnetic tunnel junction (MTJ) layers; etching the MTJ layers to form a MTJ cell; and forming a dielectric capping layer on sidewalls of the MTJ cell, wherein the step of forming the dielectric capping layer is in-situ performed with the step of etching the MTJ layers.

18 Claims, 14 Drawing Sheets

IN-SITU FORMED CAPPING LAYER IN MTJ DEVICES

This application is a continuation of U.S. patent application Ser. No. 12/032,973, entitled "In-Situ Formed Capping Layer in MTJ Devices," filed on Feb. 18, 2008, which application is incorporated herein by reference.

TECHNICAL FIELD

The present invention relates generally to semiconductor memory devices, and more particularly to magnetoresistive random access memory (MRAM) devices and methods of manufacturing the same.

BACKGROUND

Semiconductors are used in integrated circuits for electronic applications, including radios, televisions, cell phones, and personal computing devices, as examples. One type of semiconductor device is the semiconductor storage device, such as dynamic random access memory (DRAM) or a flash memory, both of which use charge to store information.

A more recent development in semiconductor memory devices involves spin electronics, which combines semiconductor technology and magnetic materials and devices. The spins of electrons, through their magnetic moments, rather than the charge of the electrons, are used to indicate the presence of a "1" or "0". One such spin electronic device is a magnetoresistive random access memory (MRAM) device 100, sometimes referred to as a magnetic RAM, as shown in FIG. 1, which includes conductive lines (wordlines WL and bitlines BL) positioned in different directions, e.g., perpendicular to each other in different metal layers. The conductive lines sandwich magnetic stacks or magnetic tunnel junctions (MTJ) 102, which function as magnetic memory cells. FIG. 1 shows a perspective view of a portion of a prior art cross-point MRAM array 100. The MRAM device 100 includes a semiconductor wafer comprising a substrate (not shown). The substrate has a first insulating layer (also not shown) deposited thereon, and a plurality of first conductive lines or wordlines WL is formed within the first insulating layer, e.g., in a first wiring level.

In a cross-point magnetic memory device 100, each memory cell or magnetic tunnel junction (MTJ) 102 is disposed over and abuts one wordline WL. Each MTJ 102 includes three layers: ML1, TL, and ML2. The first magnetic layer ML1 is disposed over and abutting wordline WL. The first magnetic layer ML1 is often referred to as a hard magnetic layer or a fixed layer because its magnetic orientation is fixed. A tunnel layer or tunnel barrier layer TL comprising a thin dielectric layer is formed over the fixed layer ML1. A second magnetic layer ML2 is formed over the tunnel barrier layer TL. The second magnetic layer ML2 is often referred to as a soft magnetic layer or a free layer because its magnetic orientation can be switched along one of two directions. The first and second magnetic layers ML1 and ML2 may include one or more material layers.

Each MTJ 102 abuts a second conductive line or bitline BL over and abutting the second magnetic layer ML2, as also shown in FIG. 1, wherein bitline BL is positioned in a direction different from the direction of the wordline WL, e.g., the bitlines BL may be perpendicular to the wordlines WL. Array 100 of MTJs 102 includes a plurality of wordlines WL running parallel to each other in a first direction, a plurality of bitlines BL running parallel to each other in a second direction, wherein the second direction is different from the first direction, and a plurality of MTJs 102 disposed between each wordline WL and bitline BL. While bitlines BL are shown on top and the wordlines WL are shown on bottom of the array 100, alternatively, wordlines WL may be disposed on the top of the array and bitlines BL may be disposed on the bottom of the array.

The value of the resistance of a MTJ 102 depends on the way in which the magnetic moment of the soft magnetic layer ML2 is oriented in relation to the magnetic moment of the hard magnetic layer ML1. The resistance of MTJ cell 102 depends on the moment's relative alignment. For example, if the first and second magnetic layers ML1 and ML2 are oriented in the same direction, as shown in FIG. 2B, the cell resistance Rc is low. If the first and second magnetic layers ML1 and ML2 are oriented in opposite directions, shown in FIG. 2C, the cell resistance Rc is high. These two states of the MTJ cell are used to store digital information (a logic "1" or "0", high or low resistance, or vice versa).

The hard magnetic layer ML1 is usually oriented once during manufacturing. The information of the cell 102 is stored in the soft magnetic layer ML2. As shown in FIG. 2A, the currents $I_{WL}$ and $I_{BL}$ through the wordline WL and bitline BL, respectively, provide the magnetic field that is necessary to store information in the soft magnetic layer ML2. The superimposed magnetic fields of the bitline BL and wordline WL currents have the ability to switch the magnetic moment of the soft magnetic layer ML2 and change the memory state of MTJ cell 102.

An advantageous feature of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be powered up and has the capability of "remembering" the stored data (also referred to as a non-volatile memory). MRAM devices have the capability to provide the density of DRAM devices and the speed of static random access memory (SRAM) devices, in addition to non-volatility. Therefore, MRAM devices have the potential to replace flash memory, DRAM, and SRAM devices in electronic applications where memory devices are needed in the future.

With the down-scaling of integrated circuits, the formation of MRAM devices experiences problems. After the formation of MTJs 102, the respective wafer is exposed to the external environment. The materials of MTJs 102 are thus prone to oxidation, and hence the sidewall portions of MTJs 102 are oxidized. This adversely affects the performance of MTJs 102. Particularly, the R-H loop of MTJs 102 will become sloped. The problem is further worsened when the dimensions of MTJs 102 are reduced with the down-scaling of integrated circuits, since the oxidized portions become greater portions of MTJs 102.

A further problem is the effect of inherent stresses in MTJs 102 to their performance. After the formation of MTJs 102, process-related inherent stresses remain in MTJs 102. It is known that the inherent stresses affect the performance of MTJs 102. The stresses may not be in a desirable direction, or have a desirable magnitude. Theoretically, after the formation of MTJs 102, a post annealing could reduce the inherent stresses. However, this cannot guarantee the reduction of the inherent stresses. New MTJ structures and methods for forming the same are thus needed to solve the above-discussed problems.

SUMMARY OF THE INVENTION

In accordance with one aspect of the present invention, a method of forming an integrated circuit includes forming magnetic tunnel junction (MTJ) layers; etching the MTJ layers to form a MTJ cell; and forming a dielectric capping layer on sidewalls of the MTJ cell, wherein the step of forming the dielectric capping layer is in-situ performed with the step of etching the MTJ layers.

In accordance with another aspect of the present invention, a method of forming an integrated circuit includes providing a semiconductor substrate; providing a production tool comprising a first etching chamber, a second etching chamber, and a deposition chamber; forming a bottom electrode layer over the semiconductor substrate; forming magnetic tunnel junction (MTJ) layers over the bottom electrode layer; forming a hard mask layer over the MTJ layers; in the first etching chamber, etching the hard mask layer to form a patterned hard mask layer; in the second etching chamber, etching the MTJ layers to form a plurality of MTJ cells, wherein the step of etching the MTJ layers is in-situ performed with the step of etching the hard mask layer; in the deposition chamber, forming a dielectric capping layer over the plurality of MTJ cells, wherein the dielectric capping layer covers sidewalls of the plurality of MTJ cells, and wherein the step of etching the MTJ layers is in-situ performed with the step of forming the dielectric capping layer; and patterning the bottom electrode layer to form a plurality of bottom electrodes over the semiconductor substrate, wherein the plurality of bottom electrodes forms an array.

In accordance with yet another aspect of the present invention, a method of forming an integrated circuit includes forming MTJ layers; etching the MTJ layers to form a plurality of MTJ cells, wherein the plurality of MTJ cells have inherent stresses; and forming a dielectric capping layer on sidewalls of the plurality of MTJ cells. The dielectric capping layer has a non-neutral stress compensating for the inherent stresses in the plurality of MTJ cells.

In accordance with yet another aspect of the present invention, an integrated circuit includes a MTJ cell; and a dielectric capping layer abutting sidewalls of the MTJ cell. The dielectric capping layer has a non-neutral stress, while an internal stress of the MTJ cell is substantially neutral.

In accordance with yet another aspect of the present invention, an integrated circuit include a MTJ cell; a top electrode overlying the MTJ cell; and a dielectric capping layer abutting sidewalls of the MTJ cell, wherein the sidewalls of the MTJ cells are substantially un-oxidized.

By forming a dielectric capping layer on MTJ cells before a vacuum break, the adverse oxidation of the MTJ cells is substantially eliminated.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel magnetic tunnel junction (MTJ) and methods of forming the same are provided. The intermediate stages of manufacturing embodiments of the present invention are illustrated. Throughout the various views and illustrative embodiments of the present invention, like reference numbers are used to designate like elements.

Figure 1:
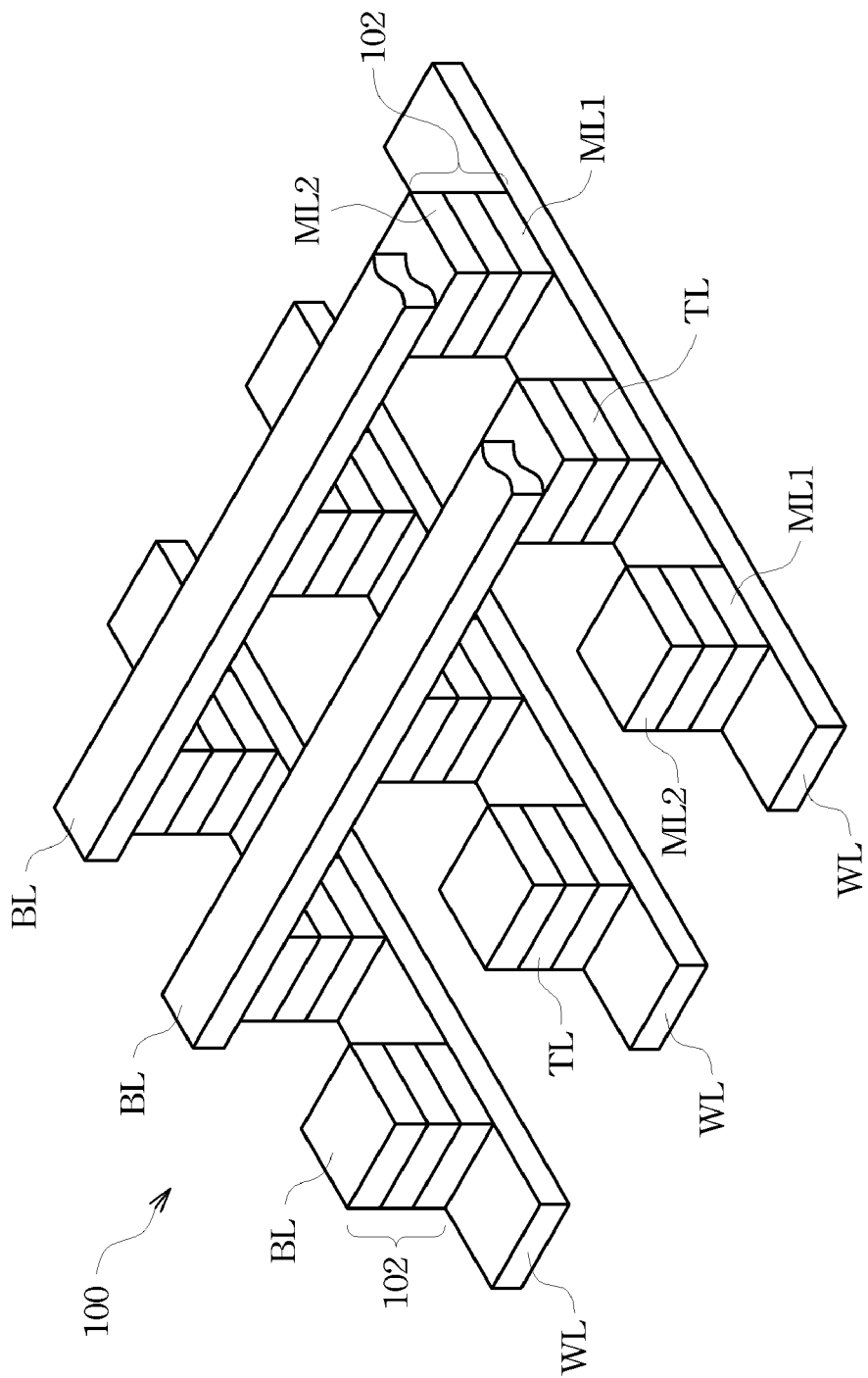
FIG. 1 illustrates a perspective view of a conventional magnetoresistive random access memory (MRAM) array, with wordlines and bitlines disposed below and above each memory cell.
Figure 2A:
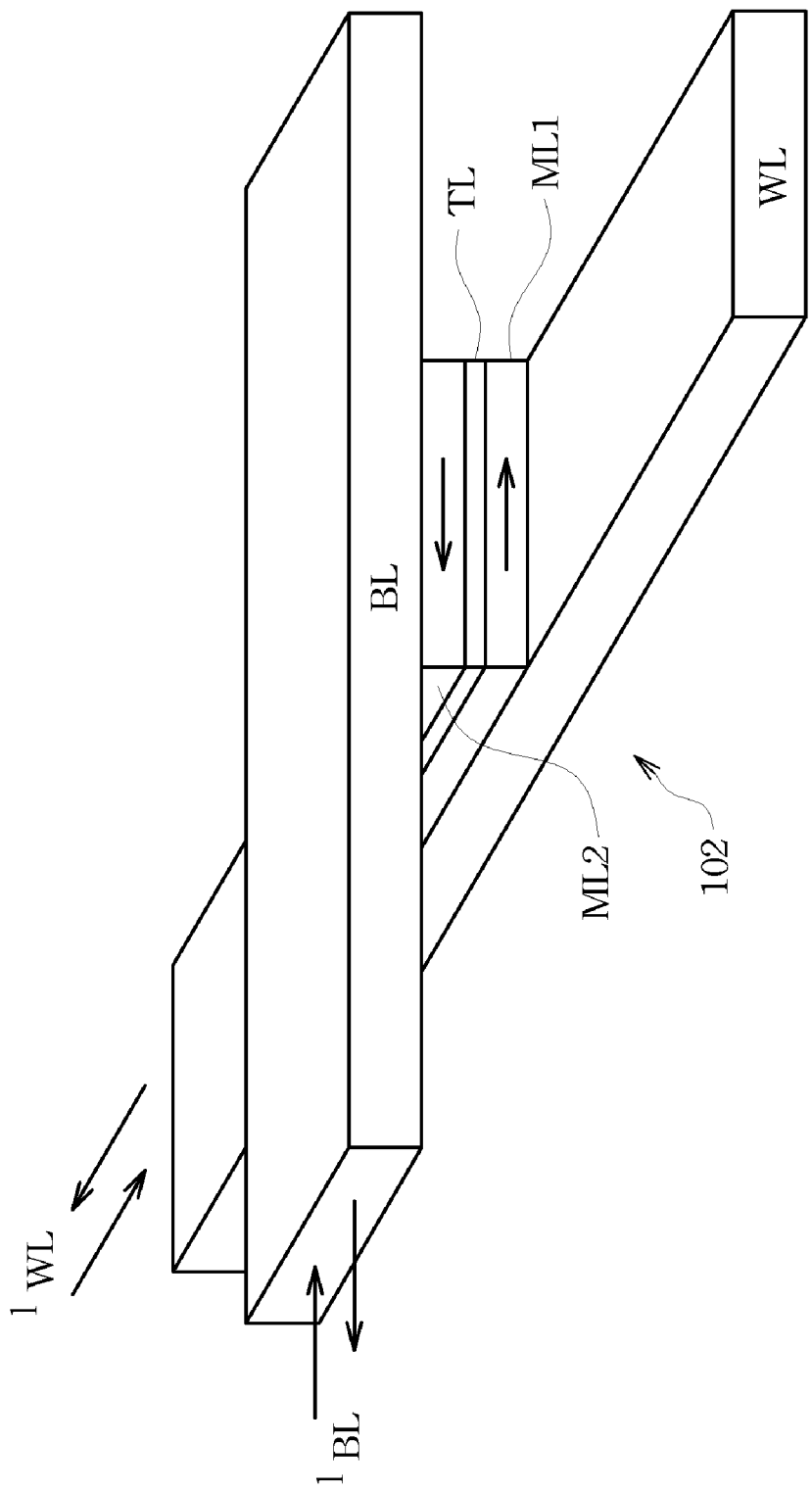
FIGS. 2A through 2C illustrate a single MRAM cell and the currents used to program the cell.
Figure 2B:
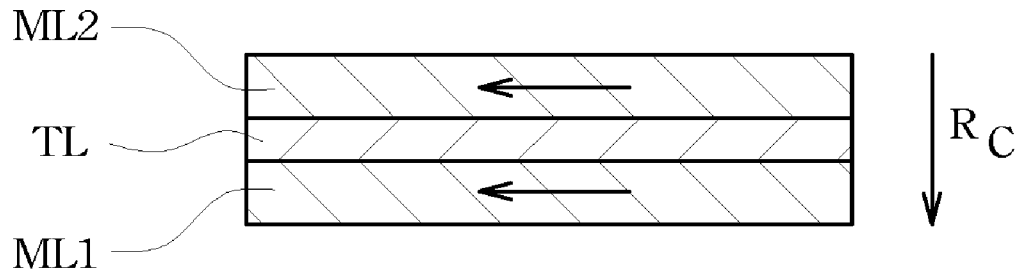
Figure 2C:
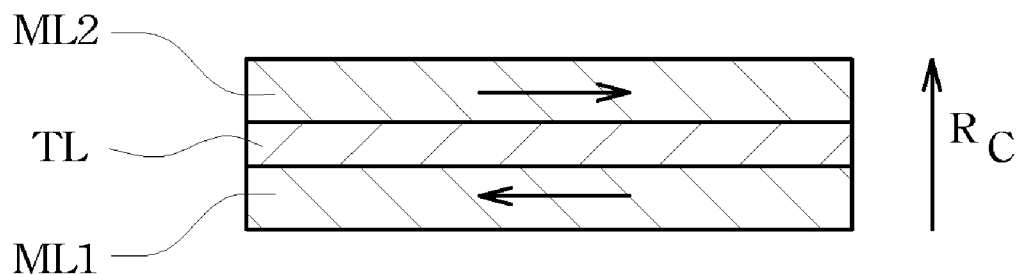
Figure 3:
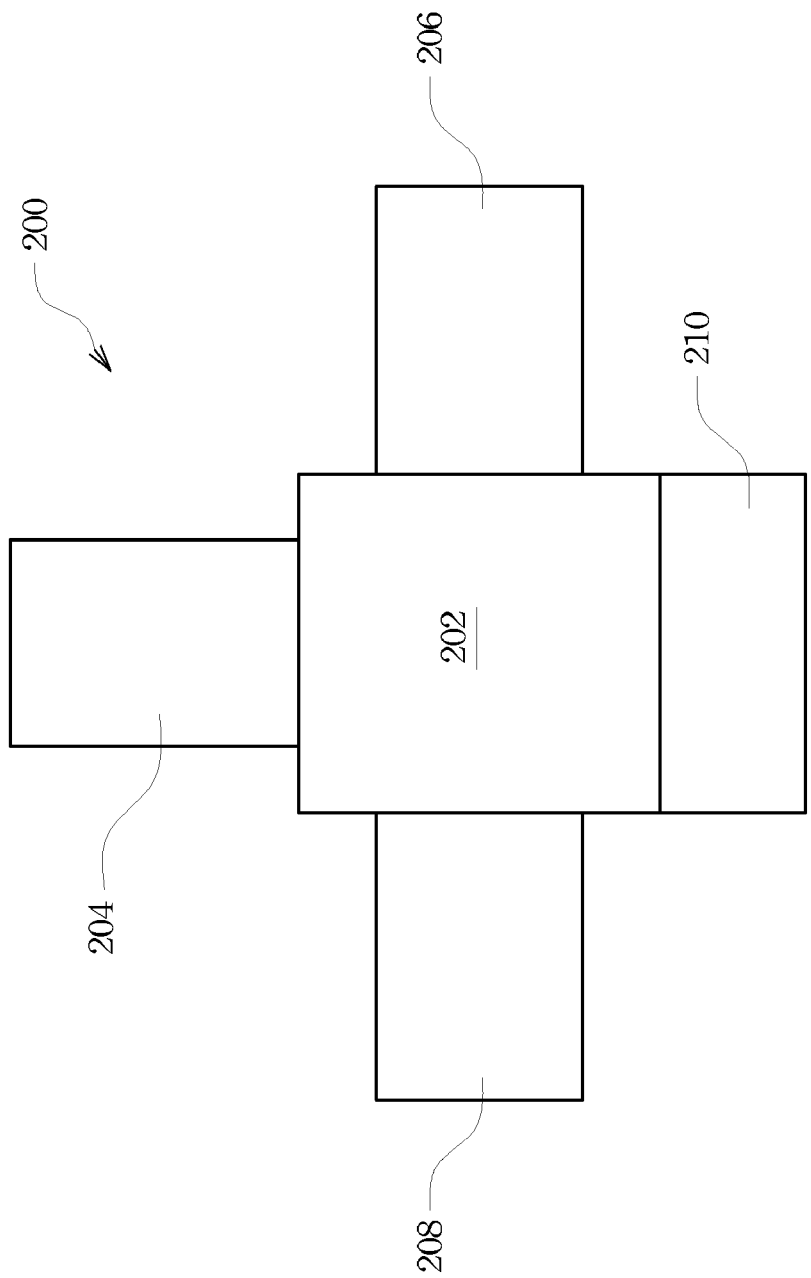
FIG. 3 illustrates a production tool for forming embodiments of the present invention.

FIG. 3 illustrates production tool 200 for forming the embodiments of the present invention. Production tool 200 includes transfer chamber 202 for transferring wafers, etching chambers 204 and 206 for etching components on the wafers, and deposition chamber 208. Production tool 200 further includes loadlock 210 for loading the wafers into, and unloading wafers from, transfer chamber 202. The wafers may be transferred between chambers 204, 206, and 208 through transfer chamber 202. During the transferring, chambers 202, 204, 206, and 208 are preferably kept vacuumed.

Figure 4:
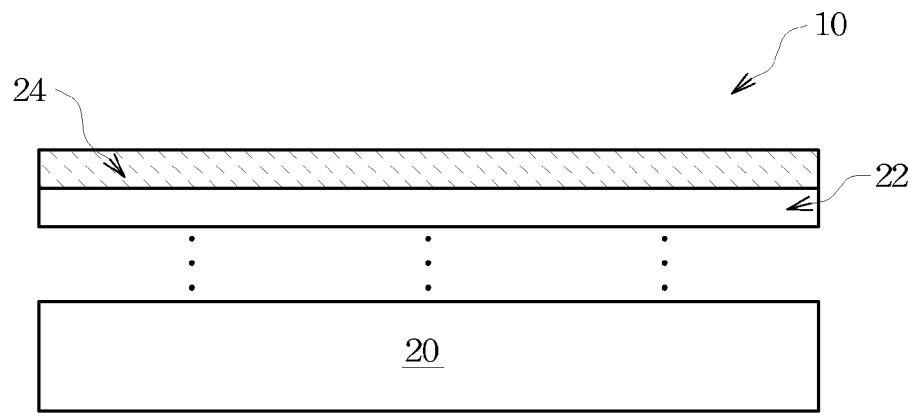
FIGS. 4 through 20 illustrate top views and cross-sectional views of intermediate stages in the manufacturing of embodiments of the present invention.

Referring to FIG. 4. Wafer 10, which includes substrate 20, is provided. Substrate 20 is preferably a semiconductor substrate, on which active devices such as transistors (not shown) are formed. The control circuits and programming circuits (not shown) of magnetoresistive random access memory (MRAM) are also formed on substrate 20.

Figure 14:
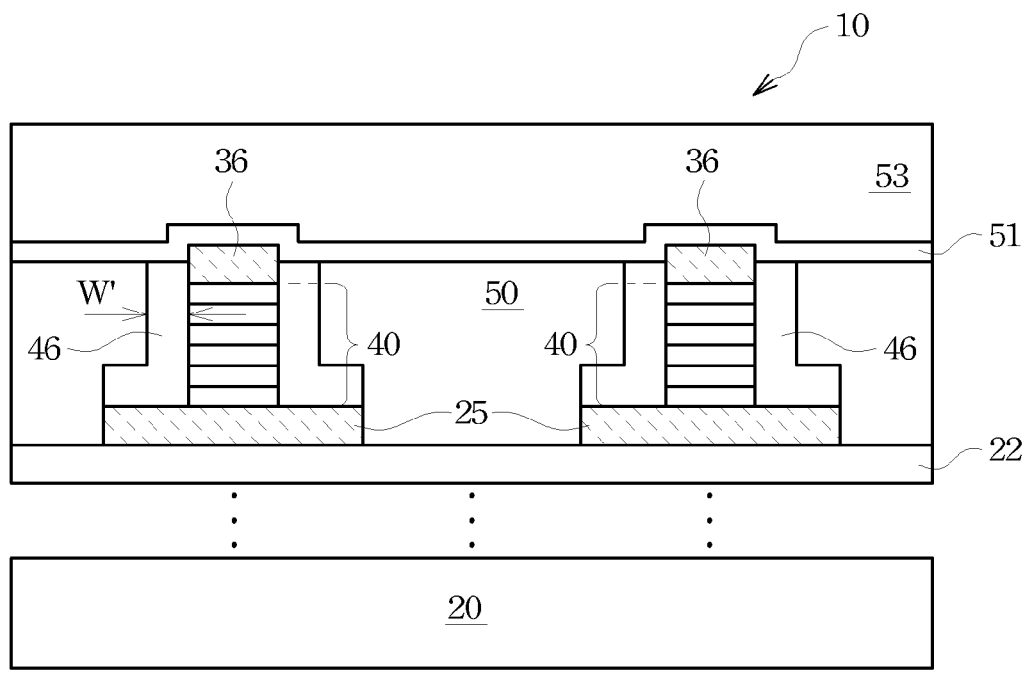

A dielectric layer 22 is formed, through which vias or contacts (not shown) are formed. Dielectric layer 22 may be formed of a low-k dielectric material having a k value less than about 3.9. The k value of dielectric layer 22 may even be lower than about 2.8. Bottom electrode layer 24 is then formed over dielectric layer 20. Bottom electrode layer 24 may be formed of conductive materials including tantalum, tantalum nitride, or the like. In an exemplary embodiment, bottom electrode layer 24 has a thickness in a range about 150 Å to about 350 Å. Although not illustrated, bottom electrode layer 24 includes a plurality of extensions extending into dielectric layer 22 and electrically connected to underlying features. In the subsequent patterning of bottom electrode layer 24, each of the extensions is included into one of the resulting bottom electrodes 25, as is shown in FIG. 14.

Figure 5:
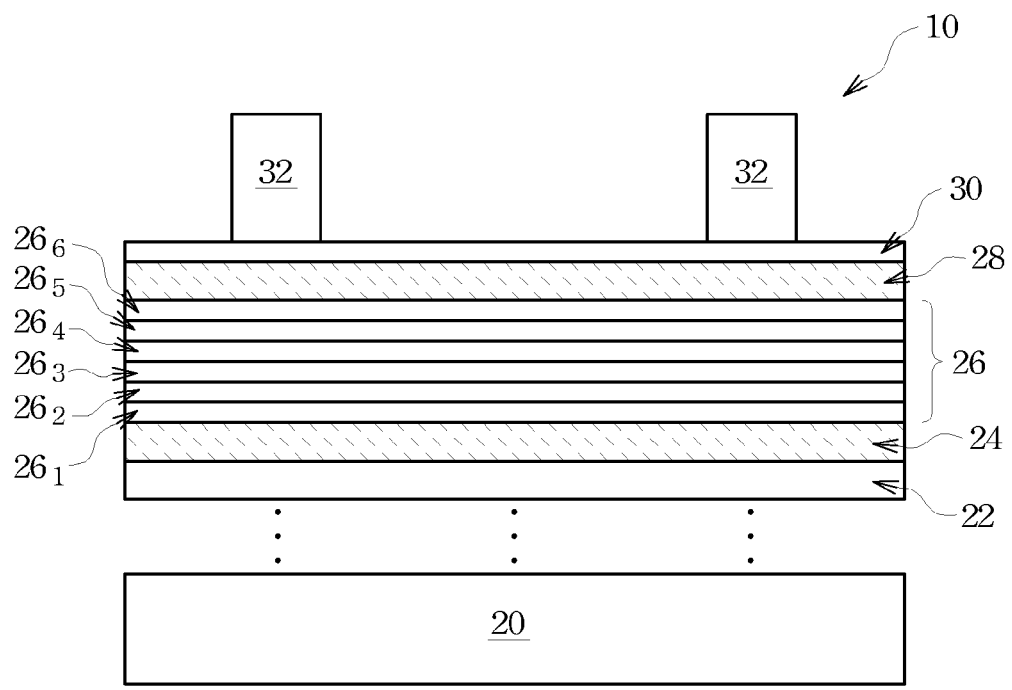

FIG. 5 illustrates the formation of MTJ layers 26, the formation of top electrode layer 28, and the application and patterning of photo resist 32. MTJ layers 26 may include various layers formed of different combinations of materials. In an exemplary embodiment, MTJ layers 26 include pinning layer $26_1$, synthetic anti-ferro-magnetic layers $26_2$, $26_3$, and $26_4$, tunnel barrier layer $26_5$, and free layer $26_6$. In an exemplary embodiment, pinning layer $26_1$ is formed of PtMn with a thickness ranging from about 100 Å to about 250 Å (e.g. 150 Å), layer $26_2$ is formed of CoFe with a thickness ranging from about 20 Å to about 60 Å (e.g. 30 Å), layer $26_3$ is formed of Ru with a thickness ranging from about a few angstroms to about tens of angstroms (e.g. 8 Å), layer $26_4$ is formed of CoFeB with a thickness of about a few tens angstroms (e.g. 30 Å), tunnel barrier layer $26_5$ is formed of MgO with a thickness ranging from about a few angstroms to about a few tens of angstroms (e.g. 10 Å), and free layer $26_6$ is formed of CoFeB with a thickness ranging from about a few angstroms to about a few tens of angstroms (e.g. 20 Å). Layer $26_4$ has a magnetic moment in one direction, which direction is fixed by pinning layer $26_1$. The magnetic moment of free layer $26_6$ may be programmed, causing the resistivity of the resulting MTJ cell to be changed between a high resistance and a low resistance.

Top electrode layer 28 is formed over MTJ layers 26, and may be formed of tantalum, tantalum nitride, or other conductive materials. Photo resist 32 is then formed and patterned. The remaining portions of photo resist 32 also form an array. Optionally, bottom anti-reflective coating (BARC) 30, such as organic ARC or inorganic ARC, is formed underlying photo resist 32. BARC 30 may be formed of silicon oxynitride, silicon rich oxide, nitrogen-free ARC materials including SiOC, or the combination thereof.

Figure 6:
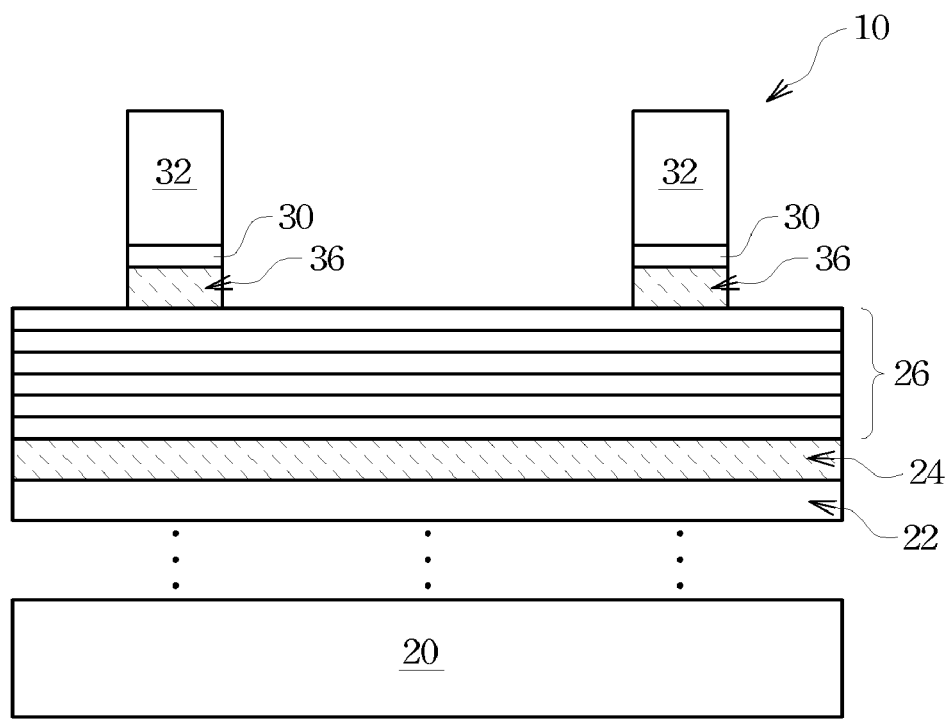
Figure 7:
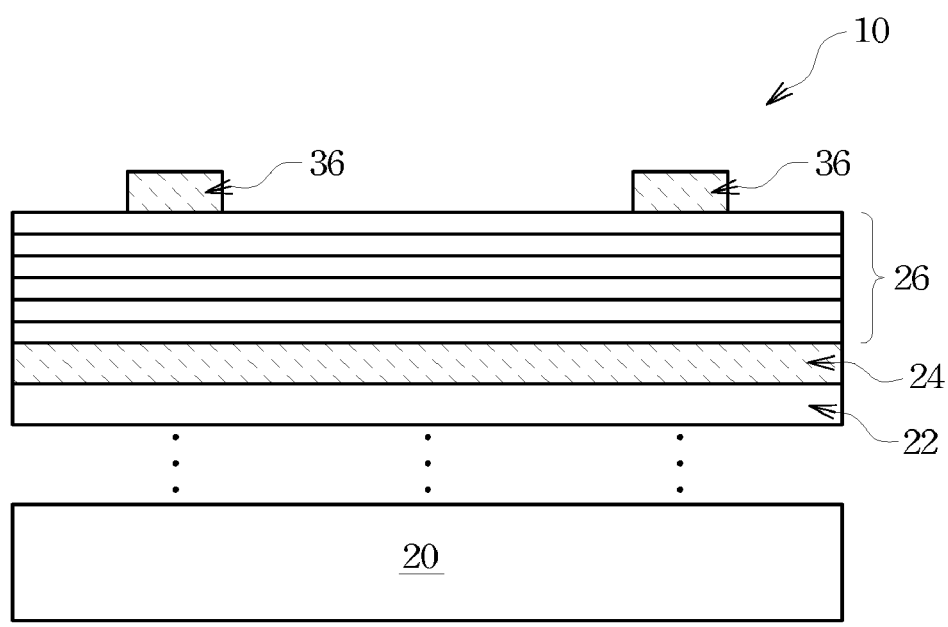

The wafer 10 as shown in FIG. 5 is then loaded into etching chamber 204 (refer to FIG. 3). BARC 30 and top electrode layer 28 are then etched, and hence forming top electrodes 36, as shown in FIG. 6. Top electrodes 36 also form an array, and are used as a hard mask for the patterning of the underlying layers. In an exemplary embodiment wherein top electrode layer 28 is formed of tantalum, the etchant may include halogen-containing compound such as $CF_4$. Next, an ashing is performed to remove photo resist 32 and BARC 30, for example, also in etching chamber 204. The resulting wafer 10 is shown in FIG. 7. In an embodiment, the ashing process is performed using oxygen-containing gases. In other embodiments, the ashing process is performed using oxygen-free process gases such as a combined gas of nitrogen and hydrogen. Advantageously, with oxygen-free process gases, the oxidation of free layer $26_6$ is substantially eliminated.

Figure 8:
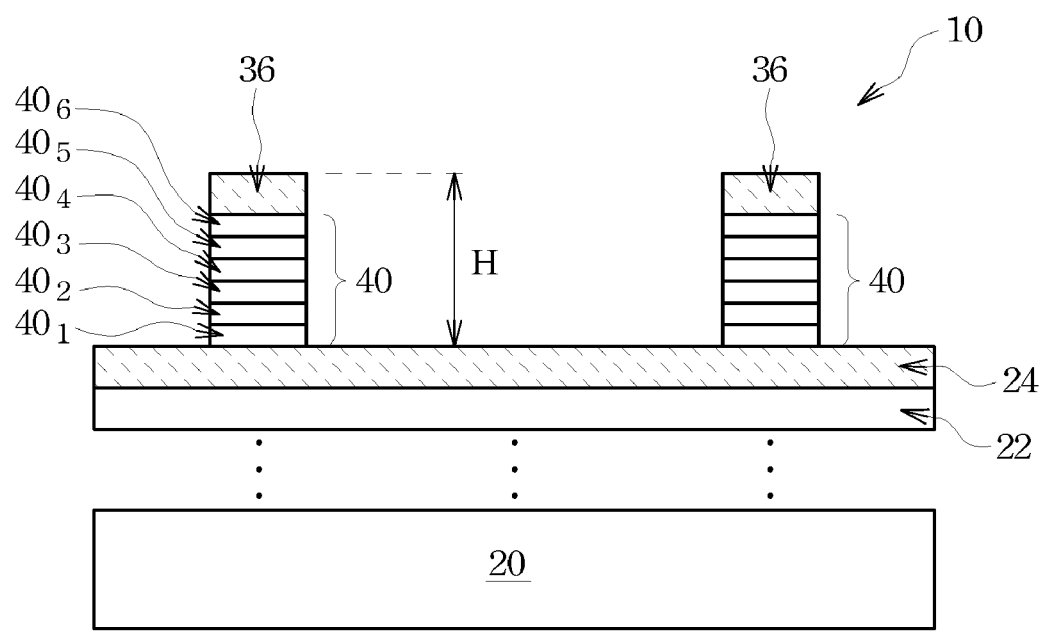

Next, wafer 10 is transferred from etching chamber 204 to etching chamber 206 through transfer chamber 202 (refer to FIG. 3). Since chambers 202, 204, and 206 are all vacuumed, during the entire transferring process, wafer 10 is kept in a vacuum environment, and is not exposed to external detrimental substances such as oxygen, moisture, and the like. MTJ layers 26 are then patterned using patterned ARC layer (not shown) or top electrodes 36 as hard masks. Throughout the description, the steps of etching top electrode layer 28 and etching MTJ layers 26 are referred to as "in-situ" performed to indicate that no vacuum-break occurs between these two steps. In an exemplary embodiment, the etchant includes alkanols, such as methanol ($CH_3OH$), ethanol, and butanol), or a carbon oxide(s) combined with an ammonia-containing compound(s) (e.g. $CO+NH_3$). Correspondingly, as shown in FIG. 8, the remaining portions of MTJ layers 26 forms MTJ cells 40, which includes layers $40_1$ through $40_6$, wherein each of the subscripts 1 through 8 are used to indicate features resulting from respective MTJ layers 26.

Figure 21A:
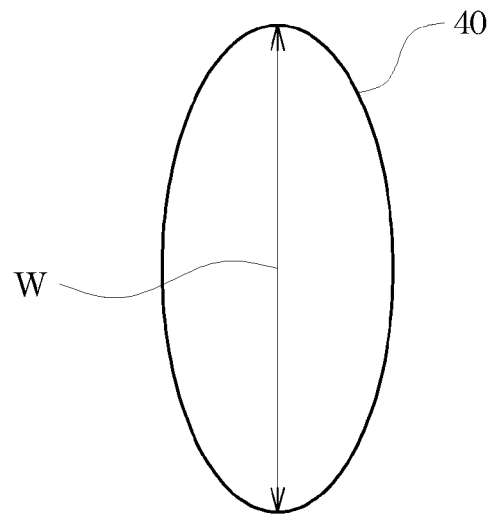
FIGS. 21A through 21C illustrate top views of exemplary MTJ cells 40 and corresponding widths W.
Figure 21B:
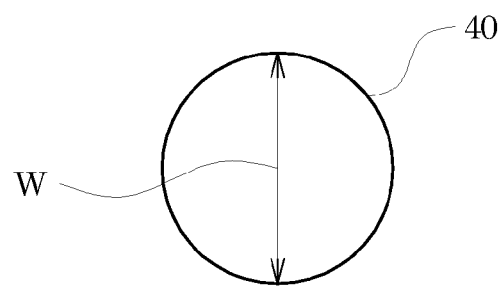
Figure 21C:
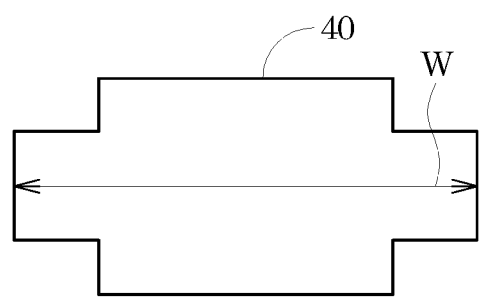

In an exemplary embodiment, MTJ cells 40 have width W of between about 30 nm and about 200 nm, and a combined height H of MTJ cells 40 and the respective overlying top electrodes 36 is about 100 nm. The width W of a MTJ cell 40 is defined as a maximum dimension of the MTJ cell. Exemplary widths W are shown in FIGS. 21A through 21C, which are top views of exemplary MTJ cells 40. One skilled in the art will realize, however, that the dimensions recited throughout the description are merely examples, and may be reduced with the down-scaling of the integrated circuits.

Figure 9:
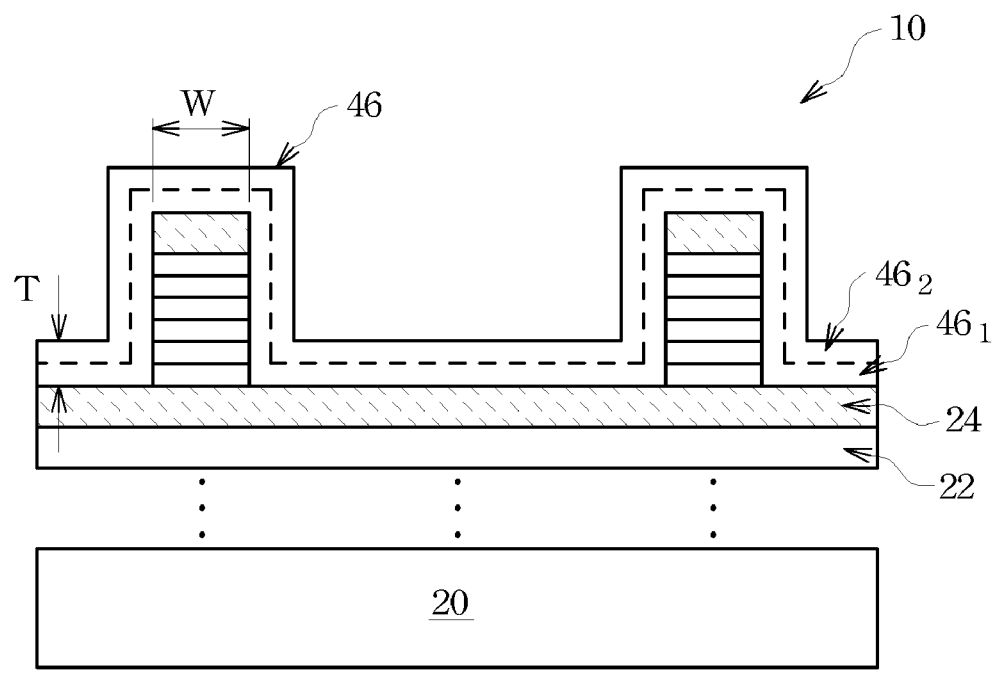

Wafer 10 is then transferred to deposition chamber 208 through chamber 202 (refer to FIG. 3). Again, since chambers 202, 206, and 208 are all vacuumed, during the transferring process, wafer 10 is free from the adverse effects of the external detrimental substances such as oxygen, moisture, and the like. In deposition chamber 208, dielectric capping layer 46 is formed, and the resulting structure is shown in FIG. 9. Throughout the description, the steps of etching MTJ layers 26 and forming dielectric capping layer 46 are referred to as "in-situ" performed to indicate that no vacuum-break occurs between these two steps. The term "in-situ" may also indicate that between the steps of etching MTJ layers 26 and forming dielectric capping layer 46, wafer 10 is only exposed to environments containing significant lower levels of oxygen, moisture, than in the open air, even though wafer 10 may be exposed to pressures up to a standard atmosphere. In this case, the weight percentages of oxygen and moisture levels in the environments are preferably less than about 10 percent the respective weight percentages of the oxygen and moisture in open air. In the case no vacuum break occurs between the steps of etching MTJ layers 26 and forming dielectric capping layer 46, the partial pressure of oxygen, moisture, and the like is less than about 15 Torr, and preferable less than about $10^{-3}$ Torr, or even less than about $10^{-5}$ Ton. Dielectric capping layer 46 may include commonly known dielectric materials such as silicon nitride, silicon carbide, carbon-doped silicon nitride, carbon-doped silicon oxide, silicon oxynitride, and combinations thereof. Dielectric capping layer 46 may also be a composite layer including two or more layers, for example, layers $46_1$ and $46_2$, which are formed of different materials such as a silicon nitride/silicon carbine stack. In this case, layer $46_2$ may be formed in an environment containing significant level of oxygen, moisture, and the like.

Figure 10:
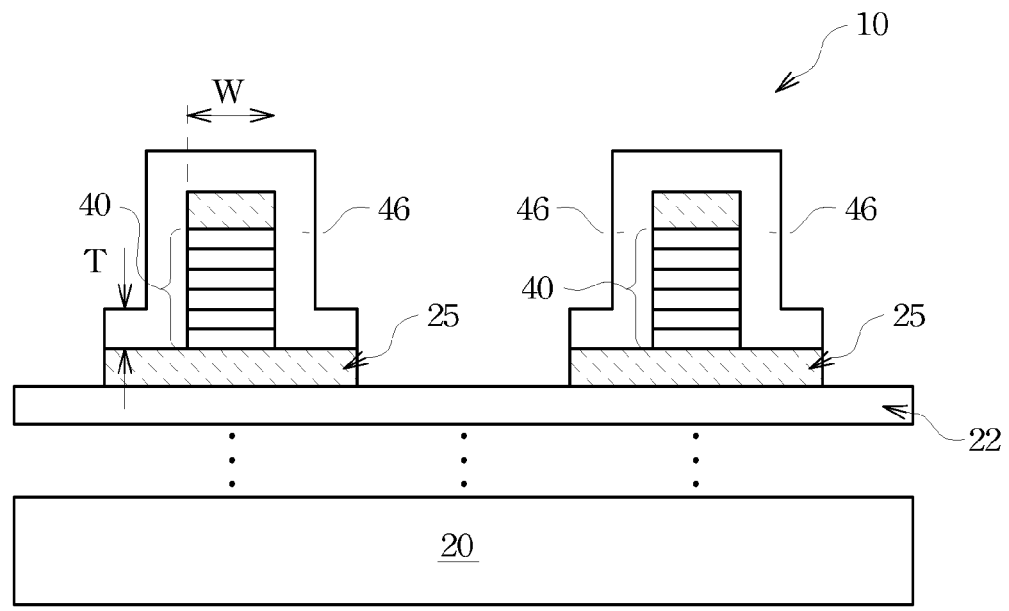

FIG. 10 illustrates the patterning of dielectric capping layer 46 and bottom electrode layer 24. The remaining portions of dielectric capping layer 46 cover the top and sidewalls of each of the MTJ cells 40. Bottom electrode layer 24 is patterned to form bottom electrodes 25. Please note that although not illustrated, each of the bottom electrodes 25 may include a portion extending into dielectric layer 22, and electrically connected to underlying features (refer to FIG. 20 for details).

MTJ cells 40 may have processed-induced inherent stresses. Typically, MTJ cells 40 each have an easy axis (for example, a long axis if the MTJ cells have the shape of ellipses if viewed from top). If the magnetic moments are well aligned to the easy axis, the moment-switching of the MTJ cells may be performed coherently, and hence the switching uniformity may be increased. However, the inherent stresses of the MTJ cells 40 may cause the easy axis to deviate from the expected direction, for example, the long axis. As a result, it is difficult to predict the easy axis and to align the easy axis to the desirable direction. Dielectric capping layer 46 thus preferably has an inherent stress, preferably no greater than about 3 GPa, and hence applies a stress to compensate for the inherent stress in MTJ cells 40. In an embodiment of the present invention, due to the compensation, the stress in MTJ cells 40 is at least reduced, and possibly substantially eliminated, for example, to about 1 MPa or less. Throughout the description, a feature having substantially no compressive and no tensile stress is referred to as being neutral. In an exemplary embodiment, if MTJ cells 40 have internal compressive stresses, dielectric capping layer 46 preferably has a tensile stress. Conversely, if MTJ cells 40 have internal tensile stresses, dielectric capping layer 46 preferably has a compressive stress. In other embodiments, the stress in dielectric capping layer 46 actually increases the stress in MTJ cell 40. The net result is to align the easy axis to the desirable direction and to improve the performance of MTJ cells 40.

Preferably, the thickness T of dielectric capping layer 46 is great enough to apply suitable stresses and to provide insulations. On the other hand, the thickness T should not be too great to cause process difficulty. As one skilled in the art will perceive, dielectric capping layer 46 needs to be thicker if the intrinsic stress of dielectric capping layer 46 is smaller, or the inherent stresses of MTJ cells 40 are greater. Preferably, thickness T is great enough such that a resulting spacer width W' (refer to FIGS. 11 and 12) after a subsequent removal process to dielectric capping layer 46 is no greater about two times of width W of MTJ cells 40. In an exemplary embodiment, thickness T of dielectric capping layer 46 is between about 20 Å and about 1 kÅ, depending on the intrinsic stress of dielectric capping layer 46 and the inherent stresses of MTJ cells 40. Experiments may be performed to determine the optimum stress and optimum thickness of dielectric capping layer 46.

One of ordinary skilled in the art will recognize that the stress generated in dielectric capping layer 46 is related to the process conditions, and a wide range of compressive and tensile stresses can be generated by the same dielectric material. For instance, silicon nitride deposited by low-pressure chemical vapor deposition (LPCVD) may have a tensile stress. Likewise, silicon nitride deposited by plasma-enhanced chemical vapor deposition (PECVD) may have a compressive stress. Also, even formed using a same method and a same material, the process conditions, such as temperatures may also affect the stress in the resulting dielectric capping layer 46. Preferably, the deposition temperature for forming dielectric capping layer 46 is lower than about 450° C., such as between about 200° C. and 350° C. The deposition temperature may even be between about 20° C. and about 120° C. The low deposition temperature advantageously reduces the inter-diffusion between the layers of MTJ cells 40, and hence their performance may be improved. The other applicable formation methods for forming dielectric capping layer 46 include spin-on coating, low temperature CVD, laser ablation deposition, and the like. In the case dielectric capping layer 46 includes more than one layer, for example, layers $46_1$ and $46_2$ formed of different materials, layers $46_1$ and $46_2$ may have different stresses.

Figure 11:
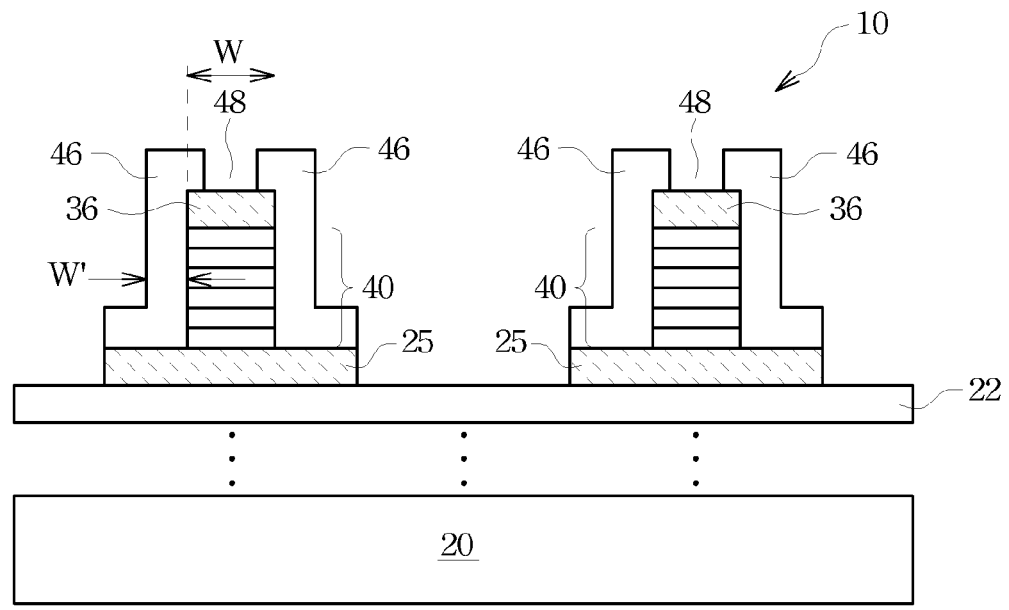

Protected by dielectric capping layer 46, MTJ cells 40 are insulated from external detrimental substances such as oxygen and moisture, and hence can be taken out of the vacuum environment without causing the oxidation of the sidewalls of MTJ cells 40. In FIG. 11, dielectric capping layer 46 is patterned to form openings 48, exposing a portion of each of top electrodes 36. In subsequent steps, contacts may be formed in openings 48.

Figure 12:
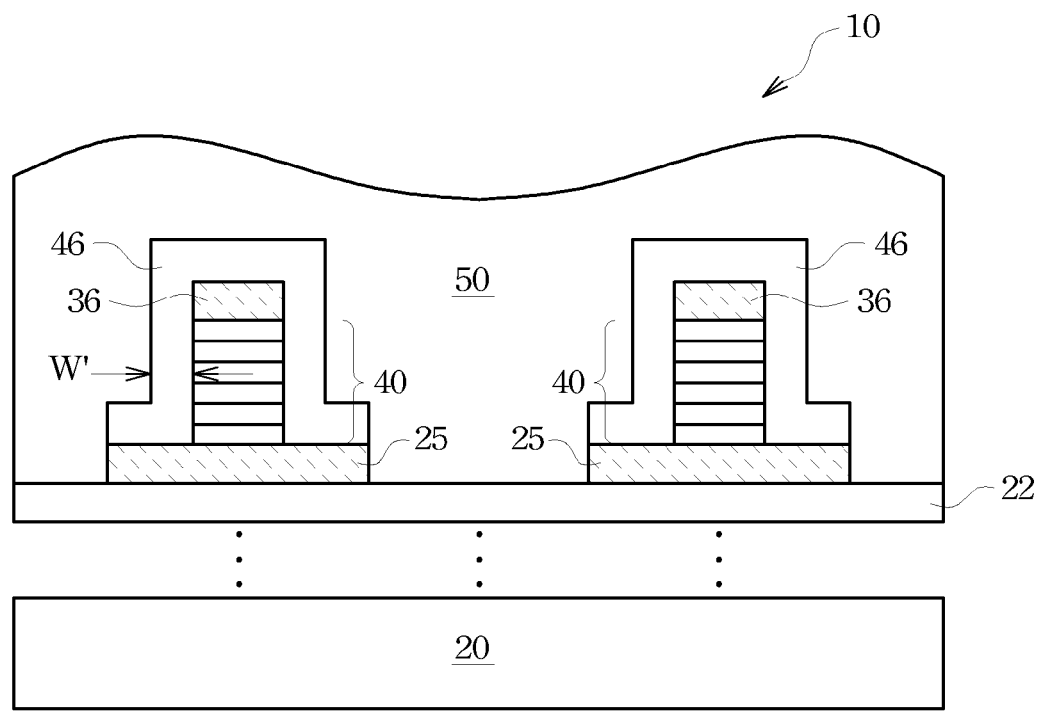
Figure 13:
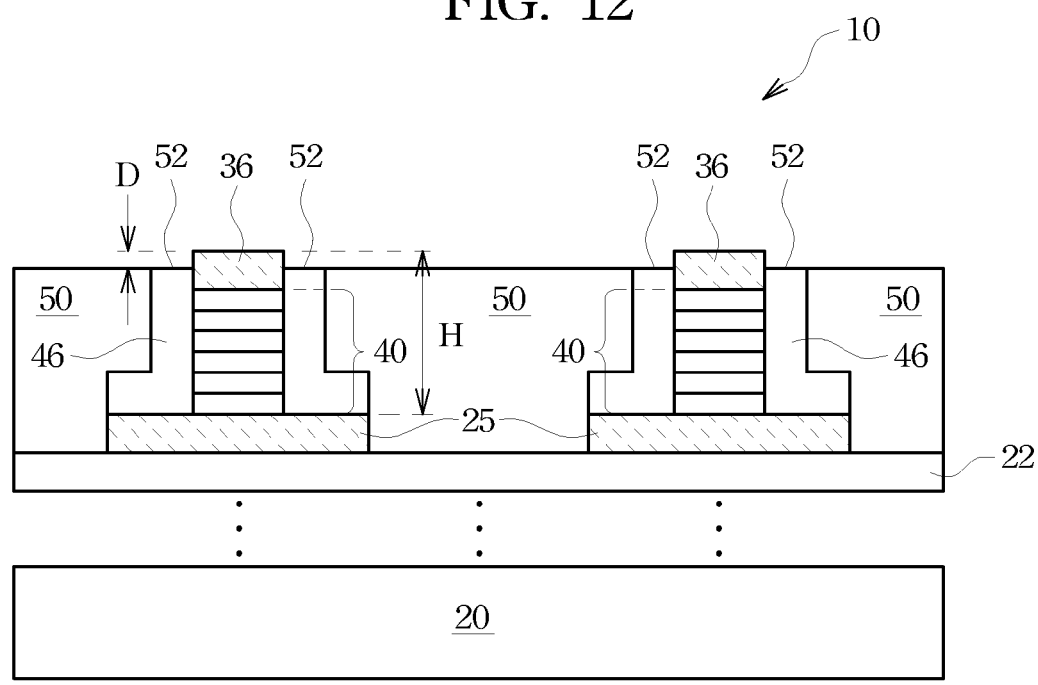

FIGS. 12 and 13 illustrate another embodiment for exposing top electrodes 36. In FIG. 12, an additional dielectric layer 50, which may be an oxide layer comprising carbon-containing silicon oxide, fluorine-containing silicon oxide, silicon carbine, or a low-k dielectric material having a dielectric constant less than about 3.2 (such as polyimide and the like) used for forming inter-metal dielectrics, is deposited over dielectric capping layer 46, and the gaps between MTJ cells 40 are fully filled. Dielectric layer 50 is preferably formed of a different material than that of dielectric capping layer 46, although they can be the same. The same dielectric layer 50 may also be gap-filled into the structure shown in FIG. 11. In FIG. 13, a removal process, such as etch back or a chemical mechanical polish (CMP), is performed, until the top surfaces of top electrodes 36 are exposed. Preferably, the top edges 52 of the remaining portions of dielectric capping layer 46 are higher than the top surfaces of MTJ cells 40, so that none of the MTJ cells 40 are exposed to the external environment. The difference D is preferably between about ⅕ and about ¾ of the combined height H of top electrodes 36 and MTJ cells 40 to ensure the top surfaces of top electrodes 36 are exposed, while no sidewalls of MTJ cells 40 are exposed.

Figure 15:
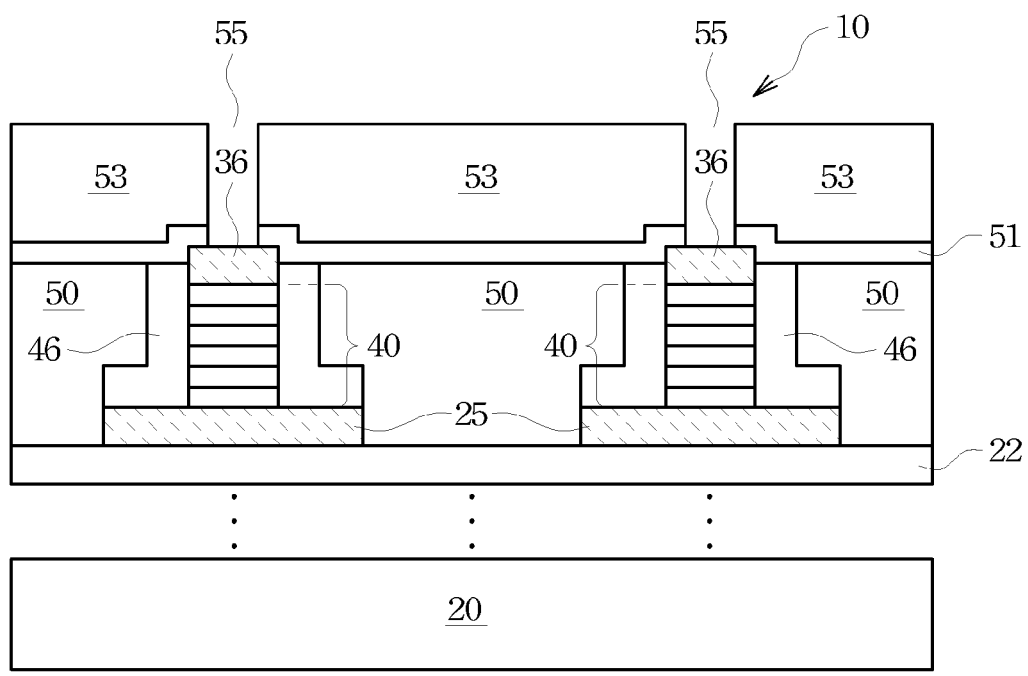

FIGS. 14 and 15 illustrate another embodiment for exposing top electrodes 36. Referring to FIG. 14, optional etch stop layer 51 and an additional dielectric layer 53 are blanket formed. Dielectric layer 53 may be formed of essentially the same material as dielectric layer 51, which may include a carbon-containing silicon oxide, a silicon carbine, a nitrogen-containing oxide, a silicon nitride, a silicon oxynitride, or a dielectric material having a dielectric constant less than about 4.2. Dielectric layer 53 may also be formed of silicon oxide, or polyimide. A CMP is performed to the dielectric layer 53, until a desirable thickness is achieved. Next, as shown in FIG. 15, via openings 55 are formed by etching through dielectric layer 53 etch stop layer 51 to expose the top surfaces of top electrodes 36. Contact plugs (not shown) may then be formed.

Figure 16:
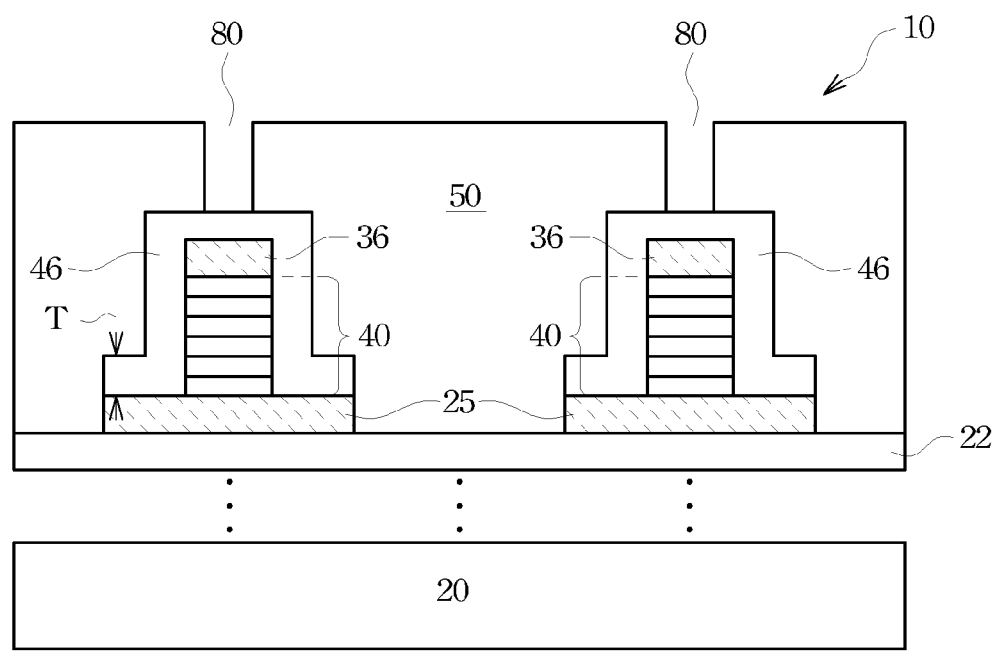
Figure 17:
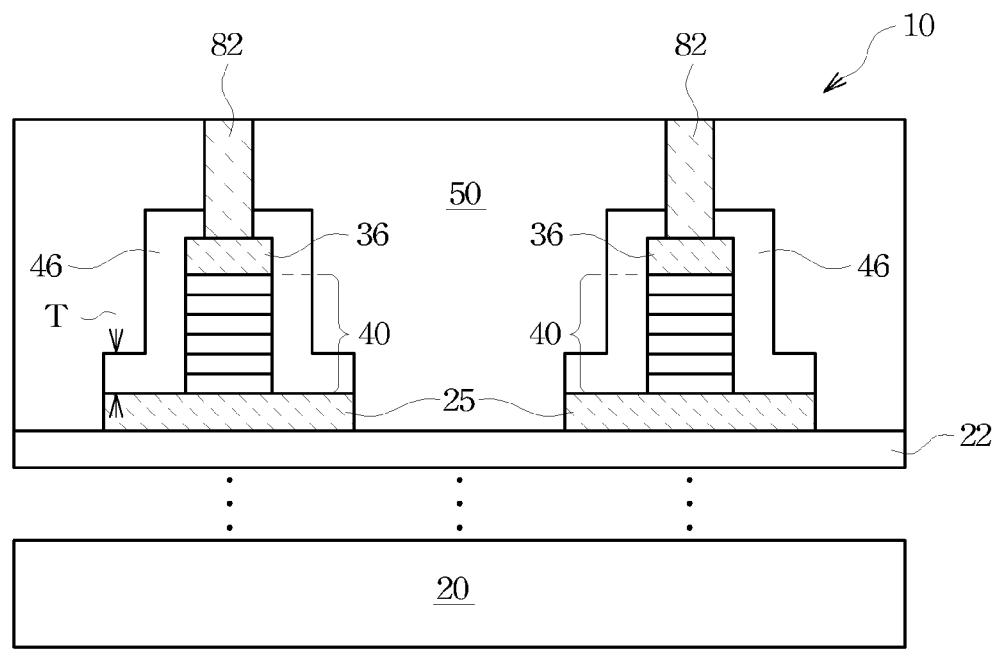

FIGS. 16 and 17 illustrate yet another embodiment for exposing top electrodes 36. The initial structure of this embodiment may be essentially the same as shown in FIG. 12, in which the additional dielectric layer 50 (used for forming inter-metal dielectrics) is deposited over dielectric capping layer 46, and the gaps between MTJ cells 40 are fully filled. Next, in FIG. 16, a CMP is performed until a predetermined thickness. Dielectric layer 50 is then etched to form via/contact openings 80, wherein dielectric capping layer 46 acts as an etch stop layer. Next, as shown in FIG. 17, dielectric capping layer 46 is etched through via/contact openings 80, exposing the top surfaces of top electrodes 36. Vias/contacts 82 are then formed in via/contact openings 80.

Figure 18:
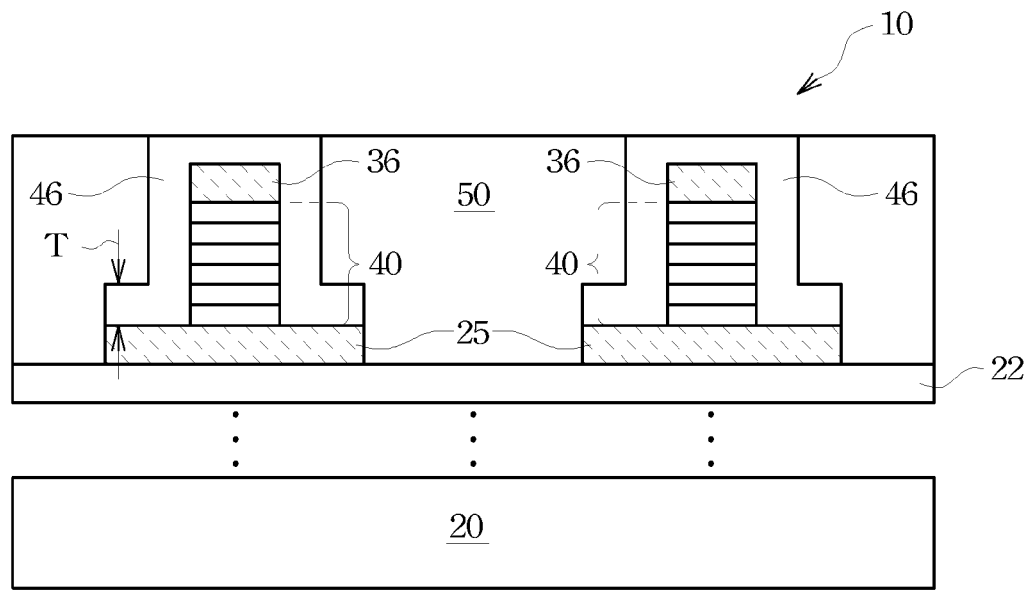
Figure 19:
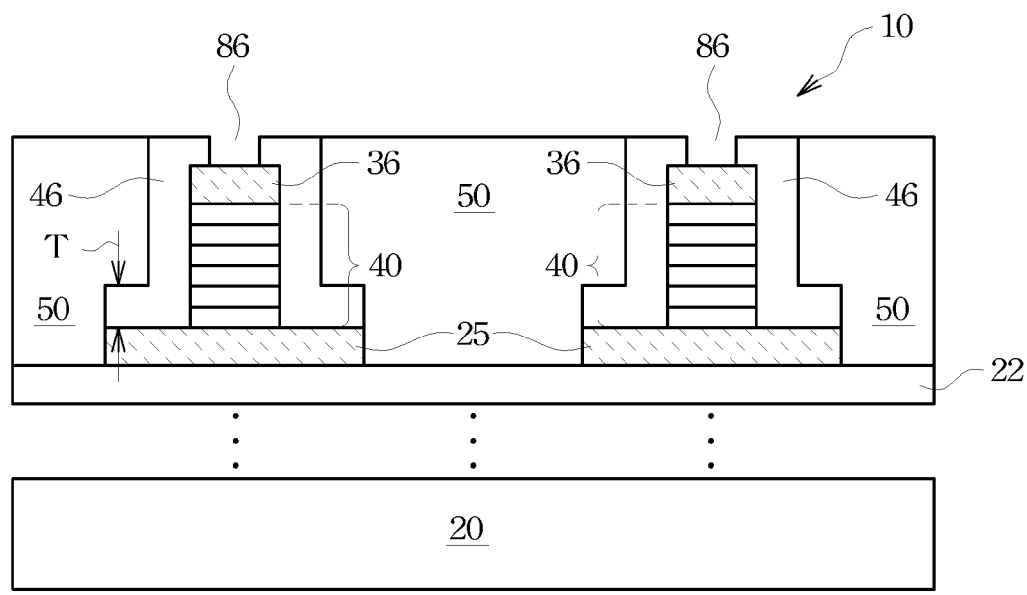

FIGS. 18 and 19 illustrate yet another embodiment for exposing top electrodes 36. The initial structure of this embodiment may be essentially the same as shown in FIG. 12, in which the additional dielectric layer 50 (used for forming inter-metal dielectrics) is deposited over dielectric capping layer 46, and the gaps between MTJ cells 40 are fully filled. A CMP is performed until the top surface of dielectric capping layers 46 are exposed. In the CMP, dielectric capping layers 46 act as CMP stop layers. The resulting structure is shown in FIG. 18. Next, as shown in FIG. 19, dielectric capping layer 46 is etched, forming openings 86. Via/contacts (not shown) will be formed in openings 86 in subsequent process steps.

Figure 20:
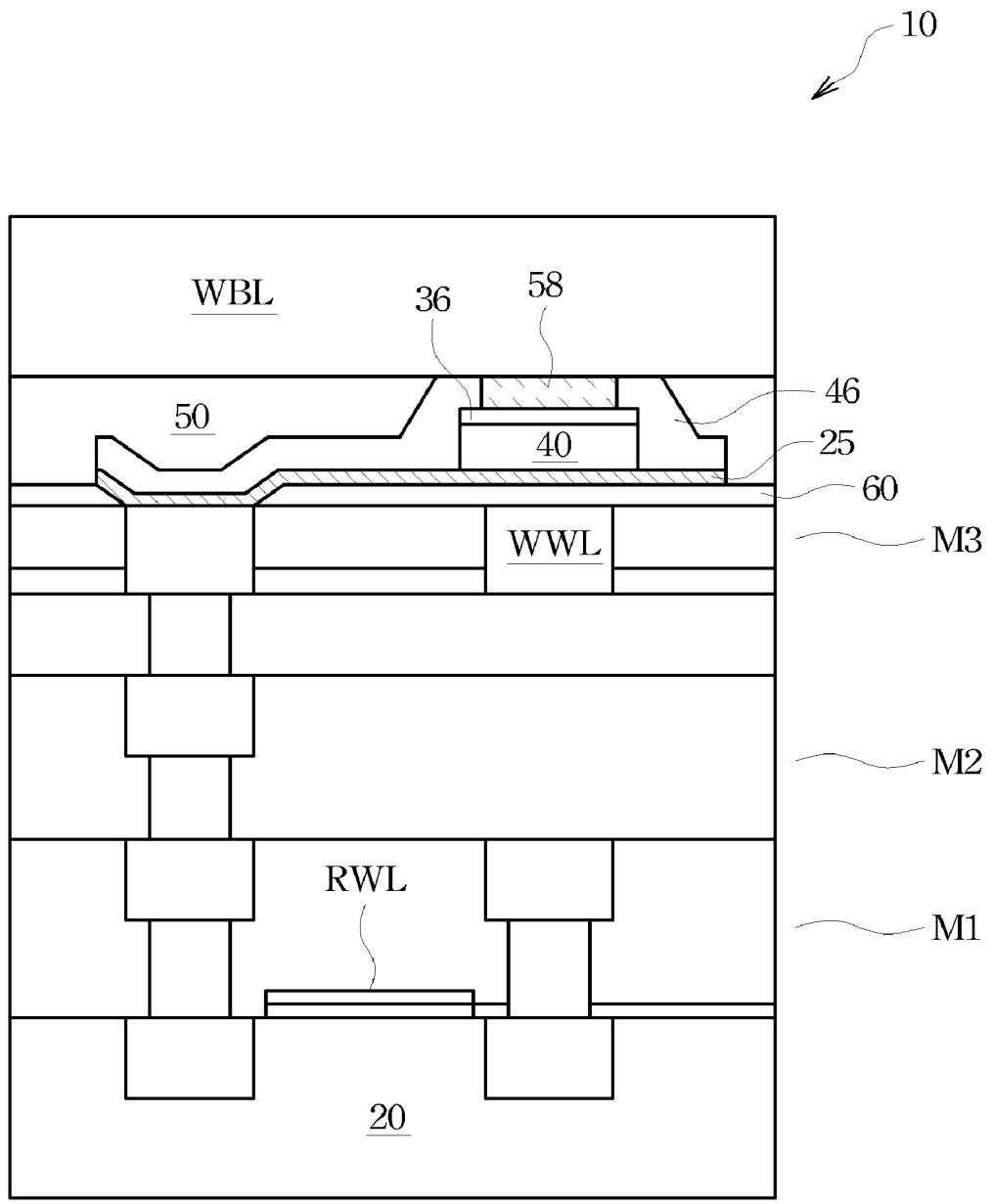

FIG. 20 illustrates a cross-sectional view of an exemplary embodiment illustrating the position of MTJ cells 40 in wafer 10. In the illustrated exemplary embodiment, MTJ cells 40 are formed in a dielectric layer over the third metallization layer (M3). One skilled in the art will realize that MTJ cell 40 may be formed in a dielectric layer over other metallization layers. Through vias and metal pads in the bottom metallization layer (M1) through metallization layer M3, bottom electrode 25 connects the MTJ cells 40 to a control transistor. Top contact 58 connects top electrode 36 and MTJ cell 40 to write bitline WBL. Write wordline WWL is formed underlying MTJ 40, and is separated from bottom electrode 25 by insulation layer 60.

The embodiments of the present invention have several advantageous features. First, by forming dielectric capping layers to protect the sidewalls of MTJ cells before the MTJ cells are exposed to external environment, the adverse oxidation of the sidewalls, and hence the adverse performance degradation of MTJ cells, is substantially eliminated. This is particularly helpful for MTJ cells formed using advanced technologies, for example, 65 nm and below, in which the oxidized portions may be a significant portion of the MTJ cells. Experiments have revealed that the R-H loops of the MTJ cells are substantially perfect squares, indicating excellent switching ability. Second, the stresses of the dielectric capping layers are adjusted, and hence better MTJ performance, such as higher MR ratio, smaller writing current, and better reliability assurance uniformity may be obtained in both cross-type and spin torque transfer (STT) type MRAM applications.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a magnetic tunnel junction (MTJ) cell comprising:
      a pinning layer;
      a tunnel barrier layer; and
      a free layer; and
   a dielectric capping layer on sidewalls of the MTJ cell comprising sidewalls of the pinning layer, the tunnel barrier layer, and the free layer, wherein the dielectric capping layer has a non-neutral stress, and wherein the dielectric capping layer is a composite layer comprising more than one layer formed of different materials.

2. The device of claim 1, wherein an internal stress of the MTJ cell is no greater than about 1 MPa.

3. The device of claim 1, wherein the non-neutral stress in the dielectric capping layer has a magnitude less than about 3 GPa.

4. The device of claim 1 further comprising a top electrode over the MTJ cell, wherein a top edge of the dielectric capping layer is lower than a top surface of the top electrode, and higher than a bottom surface of the top electrode.

5. The device of claim 1, wherein the dielectric capping layer comprises materials selected the group consisting essentially of nitrogen-containing compounds and carbon-containing compounds.

6. The device of claim 1, wherein the dielectric capping layer has a thickness no greater than about two times a width of the MTJ cell.

7. The device of claim 1, wherein edges of the MTJ cell are substantially free from oxidation.

8. The device of claim 1, wherein the dielectric capping layer further comprises a portion directly over and vertically aligned to the tunnel barrier layer.

9. The device of claim 1 further comprising a bottom electrode underlying and electrically coupled to the MTJ cell, wherein the dielectric capping layer further comprises a portion directly over and contacting the bottom electrode.

10. A device comprising:
    a magnetic tunnel junction (MTJ) cell comprising:
       a pinning layer;
       a tunnel barrier layer; and
       a free layer;
    a top electrode overlying the MTJ cell; and
    a dielectric capping layer on sidewalls of the MTJ cell comprising sidewalls of the pinning layer, the tunnel barrier layer, and the free layer, wherein the sidewalls of the MTJ cell are substantially un-oxidized, and wherein the dielectric capping layer is a composite layer comprising more than one layer formed of different materials.

11. The device of claim 10, wherein the dielectric capping layer has a non-neutral stress.

12. The device of claim 11, wherein the non-neutral stress in the dielectric capping layer has a magnitude less than about 3 GPa.

13. A device comprising:
    a bottom electrode;
    a magnetic tunnel junction (MTJ) cell over the bottom electrode;
    a top electrode over the MTJ cell; and
    a dielectric capping layer comprising:
       a top portion directly over the top electrode;
       a sidewall portion on a sidewall of the MTJ cell; and
       a bottom portion directly over the bottom electrode and vertically misaligned with the top portion and the sidewall portion, wherein the top portion, the sidewall portion, and the bottom portion form a continuous region, and wherein the dielectric capping layer is a composite layer comprising more than one layer formed of different materials.

14. The device of claim 13 further comprising:
    a pinning layer;
    a tunnel barrier layer; and
    a free layer, wherein the pinning layer, the tunnel barrier layer, the free layer, and the top electrode are substantially co-terminus with respective edges vertically aligned to each other.

15. The device of claim 13, wherein a bottom surface of the top portion contacts a top surface of the top electrode, and a bottom surface of the bottom portion contacts a top surface of the bottom electrode.

16. The device of claim 13, wherein the dielectric capping layer has a thickness no greater than about two times a width of the MTJ cell.

17. The device of claim 13, wherein edges of the MTJ cell are substantially free from oxidation.

18. The device of claim 13, wherein an internal stress of the MTJ cell is no greater than about 1 MPa.

* * * * *